United States Patent [19]

Ohtsuka et al.

[11] Patent Number: 5,105,385
[45] Date of Patent: Apr. 14, 1992

[54] CELL ARRAY PATTERN LAYOUT FOR EEPROM DEVICE

[75] Inventors: Nobuaki Ohtsuka, Yokohama; Sumio Tanaka, Tokyo; Junichi Miyamoto, Yokohama; Shigeru Atsumi, Tokyo, all of Japan

[73] Assignee: Kabushiki Kaisha Toshiba, Kawasaki, Japan

[21] Appl. No.: 703,704

[22] Filed: May 21, 1991

Related U.S. Application Data

[63] Continuation of Ser. No. 335,929, Apr. 11, 1989, abandoned.

[30] Foreign Application Priority Data

Apr. 13, 1988 [JP] Japan .................. 63-91072

[51] Int. Cl.$^5$ .................... G11C 7/02; G11C 11/34
[52] U.S. Cl. .................................. 365/185; 365/210
[58] Field of Search ............ 365/63, 51, 185, 210; 357/23.5

[56] References Cited

U.S. PATENT DOCUMENTS

| | | | |
|---|---|---|---|
| 4,094,008 | 6/1978 | Lockwood et al. | 365/210 |
| 4,314,360 | 2/1982 | Higuchi et al. | 365/210 |
| 4,371,956 | 2/1983 | Maeda et al. | 365/210 |
| 4,622,737 | 11/1986 | Ravaglia | 357/23.5 |
| 4,668,970 | 3/1987 | Yatsuda et al. | 357/23.5 |
| 4,819,212 | 4/1989 | Nakai et al. | 365/185 |
| 4,894,802 | 1/1990 | Hsia et al. | 357/23.5 |

Primary Examiner—Stuart N. Hecker
Assistant Examiner—Michael A. Whitfield
Attorney, Agent, or Firm—Finnegan, Henderson, Farabow, Garrett, and Dunner

[57] ABSTRACT

A memory cell array includes data storing memory cells which are arranged in a matrix form of m rows×n columns. The data storing memory cells are selected by means of m word lines and n bit lines. Dummy capacitance cells are arranged on the (n+1)th column of the memory cell array, and are connected to the word lines. The dummy capacitance cells are each formed of a transistor which has the same construction as a field transistor having a gate electrode formed of a polysilicon layer or the data storing memory cell and whose source is set in the electrically floating condition. Array edge memory cells are arranged on the (m+1)th row of the memory cell array, and are connected to n bit lines. The array edge memory cells have no influence on the circuit operation. A dummy memory cell is arranged in an intersecting position of the (m+1)th row and the (n+1)th column. A dummy bit line is connected to the dummy capacitance cells and dummy memory cell, and a dummy word line is connected to the array edge memory cell and dummy memory cell.

11 Claims, 8 Drawing Sheets

CELL ARRAY PATTERN LAYOUT FOR EEPROM DEVICE

This application is a continuation of application Ser. No. 335,929, filed Apr. 11, 1989, now abandoned.

BACKGROUND OF THE INVENTION

1. Field of the Invention

This invention relates to a semiconductor memory device for comparing a readout potential from a memory cell with a readout potential from a dummy memory cell (reference potential) and amplifying the difference therebetween, and more particularly to a cell array pattern layout of the semiconductor memory device.

2. Description of the Related Art

Figure 1:
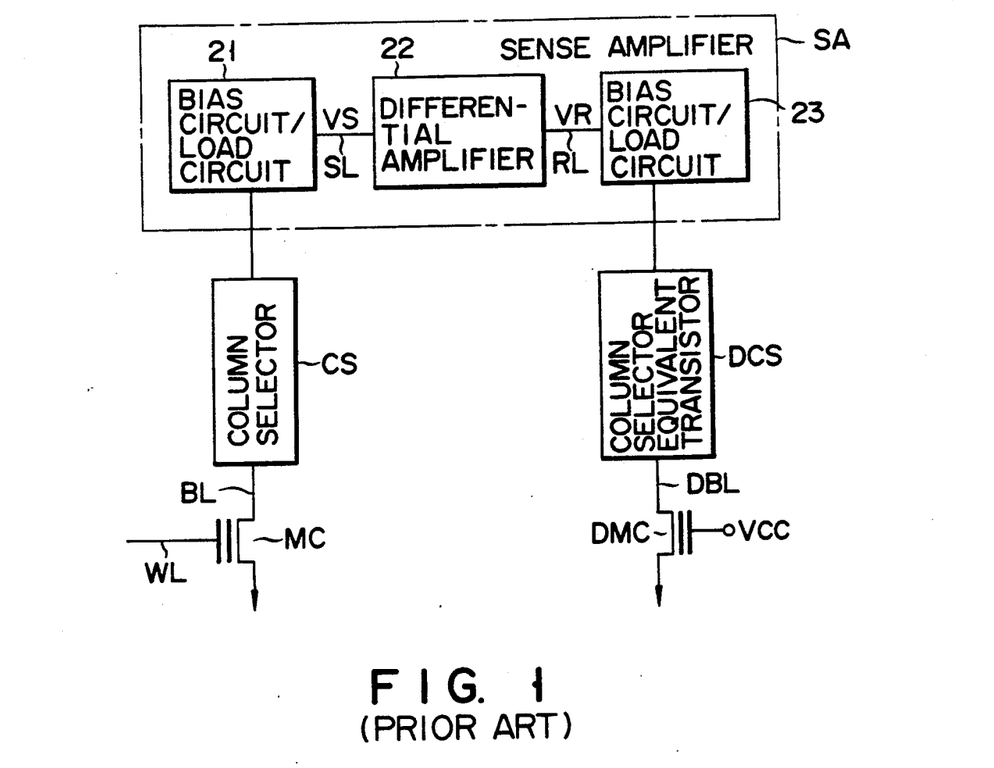
FIG. 1 is a block diagram schematically showing a data readout circuit of the prior art EPROM.

In an ultraviolet erasable and programmable read only memory (EPROM), a potential read out from a selected memory cell is compared with a potential read out from a dummy memory cell (reference potential) to determine whether stored data is "1" or "0". A circuit section used for data determination is constructed as schematically shown in FIG. 1. Data storing memory cells MC are arranged in a matrix form of m rows×n columns (only one of memory cells MC is shown in FIG. 1 as an example). One of m word lines WL is selected by means of a row decoder (not shown) and one of n bit lines BL is selected by means of column selector CS. In this way, one of memory cells MC whose control gate is connected to selected word line and whose drain is connected to selected bit line BL is selected. Memory cells MC arranged in a matrix form are connected to bias circuit/load circuit 21 via column selector CS. The potential of bit line BL which has been changed by data read out from selected memory cell MC is set to a preset level by means of bias circuit/load circuit 21. Potential VS thus set is supplied to one (comparison input terminal) of input terminals of differential amplifier 22 which receives at the other input terminal (reference input terminal) reference voltage VR from the dummy memory cell side circuit. The dummy memory cell side circuit is formed in substantially the symmetrical relation to a circuit section ranging from data storing memory cell MC to the comparison input terminal of differential amplifier 22 from the viewpoint of the circuit construction. The dummy memory cell side circuit includes dummy memory cell DMC, dummy bit line DBL, column selector equivalent transistor DCS, bias circuit/load circuit 23 and reference line (reference potential line) RL. The dummy memory cell side circuit supplies reference potential VR which is set to an intermediate potential level between the upper and lower levels of the potential of sense line SL varying according to data "0" or "1" stored in memory cell MC. Differential amplifier 22 determines data "1" or "0" by detecting whether or not potential VS of sense line SL is higher than potential VR of reference line RL. For simplifying the following explanation, a section including differential amplifier 22, a set of sense line SL and reference line RL, and a pair of bias circuits/ load circuits 21 and 23 is referred to as sense amplifier SA.

In the EPROM, in order to obtain an output which can be also used in a transistor transistor logic (TTL) circuit, an output buffer having a relatively large current driving ability is used. When the output buffer having the relatively large current driving ability is operated (in the data output mode), the potential of the power source line in the chip will fluctuate, that is, noise occurs. In the prior art, in order to suppress the noise, a method has been proposed in which the power source lines are separately arranged for the output buffer and the internal circuit. However, the noise cannot be sufficiently suppressed only by separation of the power source lines. Occurrence of the noise in the power source lines causes the potential of each node in the internal circuit supplied with power source voltage via the power source line to fluctuate. As a result, the potentials of bit line BL, dummy bit line DBL, sense line SL and reference line RL will also fluctuate.

Figure 2A:
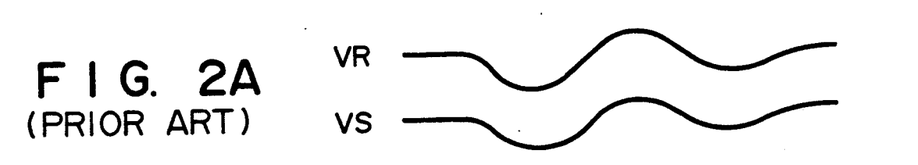
FIGS. 2A to 2C are waveform diagrams showing the potentials of the sense line and dummy sense line shown in FIG. 1 which fluctuate according to fluctuation in the power source voltage.
Figure 2B:
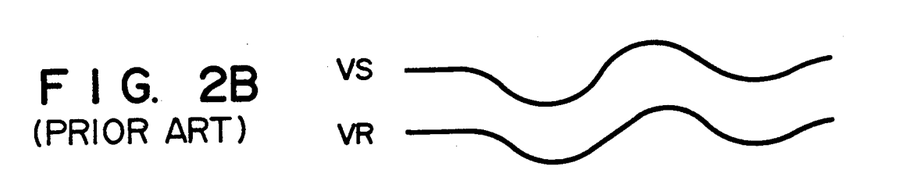
Figure 2C:
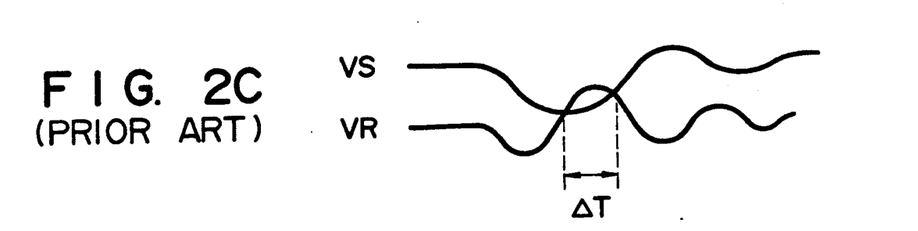

If potential VS of sense line SL connected to the input terminal of differential amplifier 22 and potential VR of reference line RL fluctuate in synchronism with each other as shown in FIGS. 2A and 2B, for example, the potential level relation between potentials VS and VR will not be erroneously reversed. Therefore, determination of data "1" or "0" may be correctly effected. However, if the periods of fluctuations in potentials VS and VR are different from each other as shown in FIG. 2C, for example, the potential level relation between potentials VS and VR may be erroneously reversed in period ΔT shown in FIG. 2C. As a result, stored data of "1" or "0" will be erroneously determined, and inverted data of the real data is output. In order to avoid such an erroneous operation, potentials VS and VR may be set to fluctuate with the same period as shown in FIGS. 2A and 2B. To this end, it becomes necessary to set the capacitances (including parasitic capacitances) associated with bit line BL and dummy bit line DBL equal to each other and set the capacitance on the comparison input terminal side (on the side of sense line SL) of differential amplifier 22 equal to that on the reference input terminal side (on the side of reference line RL).

However, with an increase in the integration density of the semiconductor memory device, the parasitic capacitance of data storing memory cell MC increases, thereby increasing the bit line load capacitance. Accordingly, it is necessary to increase the dummy bit line load capacitance. Addition of such a large capacitance to the dummy bit line causes a significant increase in the pattern area. If the bit line load capacitance caused by the data storing memory cell and the increased dummy bit line load capacitance caused by the data are out of balance, the noise will occur in the power source line, thereby causing an erroneous operation as described before.

SUMMARY OF THE INVENTION

An object of this invention is to provide a semiconductor memory device in which the bit line load capacitance and the dummy bit line load capacitance can be set in the balanced condition without significantly increasing the pattern area and thus readout data "1" or "0" from a memory cell can be correctly determined even at the time of power source voltage fluctuation.

Another object of this invention is to provide a semiconductor memory device in which charges of the dummy bit line will not be discharged when the dummy capacitance cell is set conductive and increase in the dummy memory cell size is not necessary.

The above object can be attained by a semiconductor memory device which comprises a memory cell array including data storing memory cells which are arranged in a form of m rows and n columns; m word lines arranged along respective rows of the data storing memory cells for selecting the row of the memory cells; n bit lines arranged along respective columns of the data storing memory cells for selecting the column of the memory cells to permit data transfer; dummy capacitance cells arranged on a "k"th column of the memory cell array and respectively connected to the m word lines, the "k" defining any one number selected from 1 through n+1; array edge memory cells arranged on an "l"th row of the memory cell array and respectively connected to the n bit lines which serve to make the pattern arrangement of the memory cell array symmetric and do not directly influence access operation of the memory device, the "l" defining any one number selected from 1 through m+1; a dummy memory cell arranged in a position of the "l"th row and "k"th column of the memory cell array; a dummy bit line connected to the dummy capacitance cell and dummy memory cell; and a dummy word line connected to the array edge memory cell and dummy memory cell.

With the above construction, since the memory cells, dummy memory cell and dummy capacitance cells are formed in the same memory cell array, the pattern construction can be made simple and an increase in the pattern area can be suppressed to a minimum. Further, the bit line load capacitance and the dummy bit line load capacitance can be set substantially equal by setting the patterns of the data storing memory cell and the dummy capacitance cell substantially equal to each other. As a result, the bit line potential and the dummy bit line potential fluctuate in synchronism with each other even when the power source voltage has fluctuated at the time of data output, and therefore the potential level relation between the bit line potential and the dummy bit line potential is not reversed, making it possible to determine readout data of "1" or "0" from the memory cell.

DETAILED DESCRIPTION OF THE PREFERRED EMBODIMENTS

Figure 3:
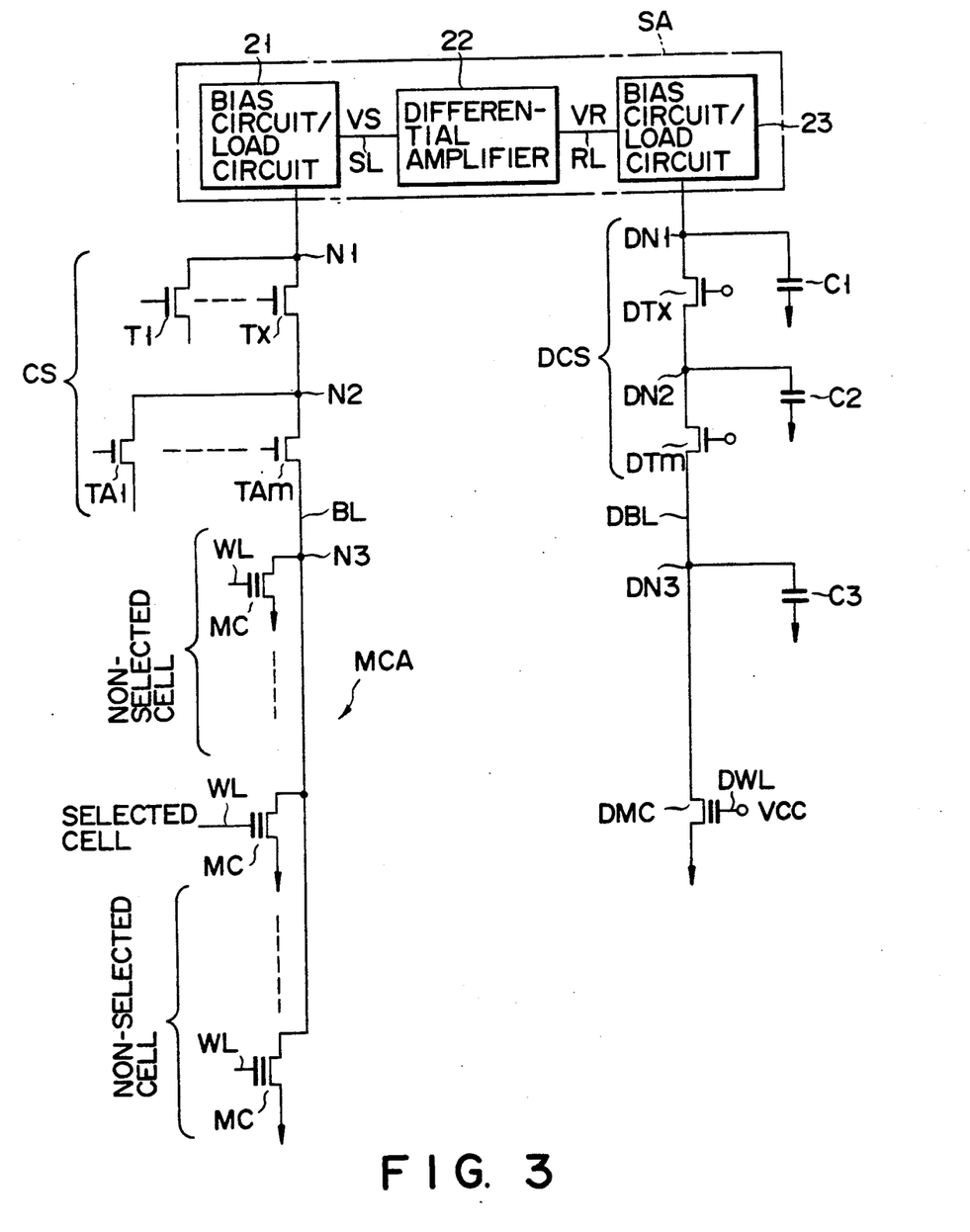
FIG. 3 is a circuit diagram showing the schematic construction of an EPROM according to one embodiment of this invention.

FIG. 3 shows the signal path from memory cells MC to sense amplifier SA and the signal path dummy memory cell DMC to sense amplifier SA in a semiconductor memory device (EPROM) according to one embodiment of this invention. In the circuit of FIG. 3, column selector CS has a two-stage tree structure. Sense amplifier SA includes bias circuits/load circuits 21 and 23 and differential amplifier 22. Input node N1 of sense amplifier SA is connected to the drains of x column selection MOS transistors T1 to Tx of the first stage and the sources of transistors T1 to Tx are respectively connected to the drains of column selection MOS transistors TA1 to TAm of the second stage. Bit line BL connected to the sources of transistors TA1 to TAm is connected to the drains of a plurality of memory cells (floating gate MOS transistors) MC. One of first-stage transistors T1 to Tx, or transistor Ti (i=1 to x), is selected by the output of a column section decoder (not shown) and set into a conductive state. At this time, if one of second-stage transistors TA1 to TAm, or transistor TAj (j=1 to m) which is connected to the source (node N2) of selected transistor Ti is selected by the output of the column decoder and set into the conductive state, memory cells MC, connected to the source (node N3) of selected transistor TAj via bit line BL, are selected. At the same time, word line WL is selectively driven by the output of a row decoder (not shown) to select one memory cells MC connected to selected bit line BL. In this case, the diffusion capacitance of the drain and source and the gate capacitance of the channel section of first-stage column selection MOS transistor Ti, which is set in the conductive state, are associated with input node N1. Further, the diffusion capacitance of the drain and the capacitance between the drain and gate of each of (x−1) column selection MOS transistors, which are set in the nonconductive state, are also associated with node N1. As in node N1, the capacitance of transistor TAj which is set in the conductive state and the capacitance of (m−1) transistors, which are set in the nonconductive state, are associated with node N2. Further, the diffusion capacitance of the drain and source and the gate capacitance of the channel section of one memory cell MC, which is set into the conductive state by selecting one of word lines WL; are associated with node N3 (or bit line BL). In addition, the diffusion capacitance of the drain and the capacitance between the drain and gate of each of the non-selected cells are also associated with node N3. In this case, since the number of memory cells MC connected to one bit line BL increases with an increase in the integration density of the memory cell, the load capacitance provided by the non-selected cells increases.

It is necessary to set a capacitance which is associated with the signal path on the side of dummy bit line DBL substantially equal to that associated with the signal path on the side of bit line BL, so that substantially the same capacitances may be associated with two input nodes N1 and DN1 of sense amplifier SA. To meet the above requirement, column selector equivalent transistor DCS is formed with a two-stage structure. That is, the first stage of transistor DCS includes MOS transistor DTx which is normally set in the conductive state, and capacitance Cl corresponding to the drain diffusion capacitance and the capacitance between the drain and gate of the (x−1) transistors which are set in the nonconductive state. The source of transistor DTx is connected to MOS transistor DTm which is normally set in the conductive state and capacitance C2 corresponding to the drain diffusion capacitance and the capacitance between the drain and gate of the (x−1) transistors which are set in the nonconductive state. Further, dummy bit line DBL connected to the source of transistor DTm which is set in the conductive state is connected to MOS transistor DMC and capacitance C3 corresponding to the drain diffusion capacitance and the capacitance between the drain and gate of the transistors which are connected to bit line BL and set in the nonconductive state.

Figure 4:
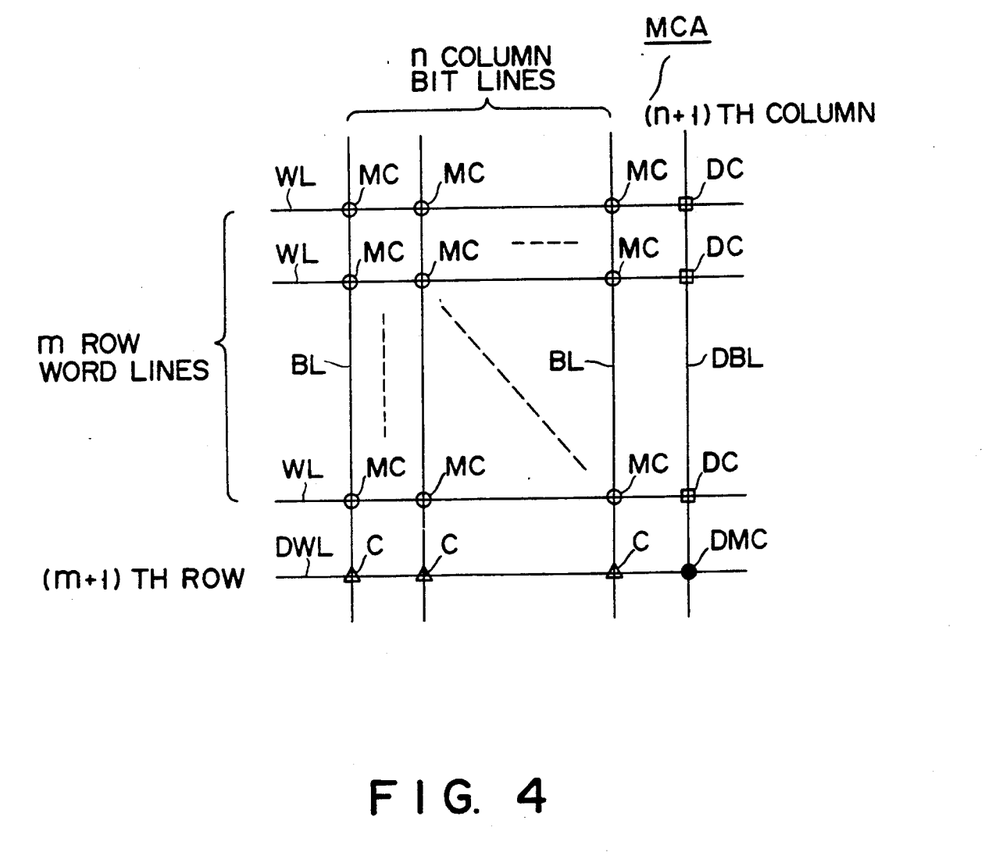
FIG. 4 is a diagram showing the arrangement of the memory cell, dummy memory cell and dummy capacitance cell corresponding to the dummy bit line load capacitance in the EPROM of FIG. 3.

In FIG. 4, the arrangement of memory cells MC, dummy memory cell DMC and dummy capacitance cells DC each corresponding to load capacitance C3 of dummy bit line DBL shown in FIG. 3 is shown. Memory cell array MCA is formed of cells arranged in a matrix form of (m+1) rows ×(n+1) columns. Cells of m rows×n columns in memory cell array MCA are used as data storing memory cells MC. A cell arranged in an intersecting position of the (m+1)th row and the (n+1)th column is used as dummy memory cell DMC. Further, cells arranged in intersecting positions of the first to m-th rows and the (n+1)th column are used as dummy capacitance cells DC (corresponding to capacitance C3 in FIG. 3) and cells C arranged in intersecting positions of the (m+1)th row and the first to n-th columns are not used for the circuit operation. Array edge memory Cells C are used to attain the symmetry and regularity in the pattern arrangement of memory cell array MCA.

With the above circuit layout, dummy memory cell DMC and dummy capacitance cells DC can be formed together with a group of data storing memory cells MC in memory cell array MCA. Therefore, it is possible to set the load capacitance of dummy bit line DBL and that of bit lines BL substantially equal to each other without significantly increasing the pattern area.

Figure 5A:
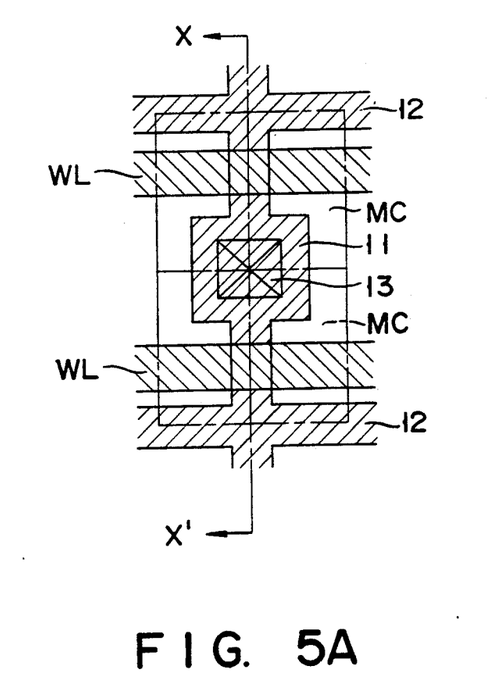
FIG. 5A is a pattern plan view of a memory cell transistor in FIG. 4.
Figure 5B:
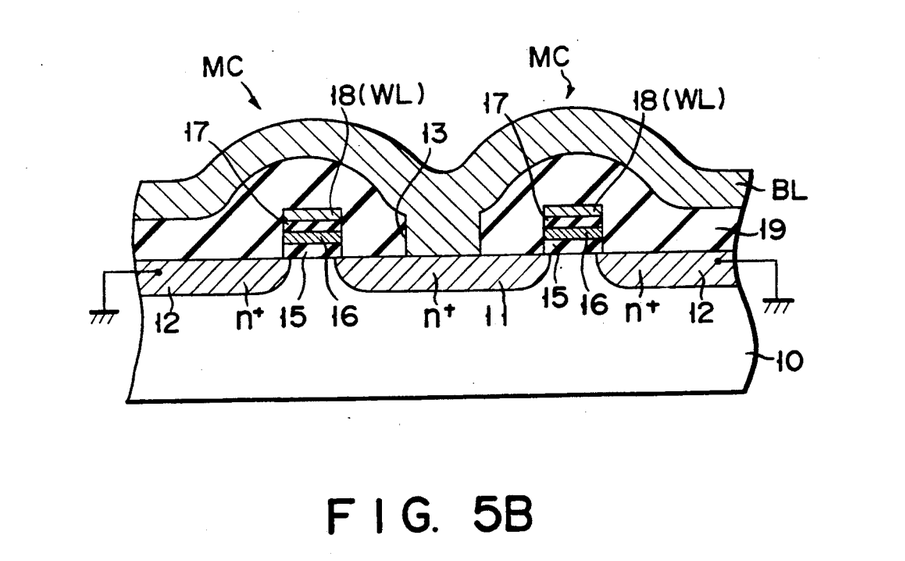
FIG. 5B is a cross sectional view of the memory cell transistor taken along line X—X' in FIG. 5A.

FIGS. 5A and 5B show the pattern construction of memory cell MC of FIG. 4. FIG. 5A is a pattern plan view and FIG. 5B is a sectional view taken along line X—X' of FIG. 5A. n+-type drain diffusion region 11 and source diffusion region 12 are formed in the surface area of p-type semiconductor substrate 10. Source diffusion region 12 is grounded. First gate insulation film 15 is formed on the channel region between drain diffusion region 11 and source diffusion region 12. Floating gate 16 is formed on first gate insulation film 15, and control gate 18 (word line WL) is formed on second gate insulation film 17 which is in turn formed on floating gate 16. Interlayer insulation film 19 is formed on the entire surface of the resultant structure, and contact hole 13 is formed in that portion of interlayer insulation film 19 which lies on drain diffusion region 11. Bit line BL is formed on interlayer insulation film 19. Bit line BL is connected to drain diffusion region 11 through contact hole 13.

Figure 6A:
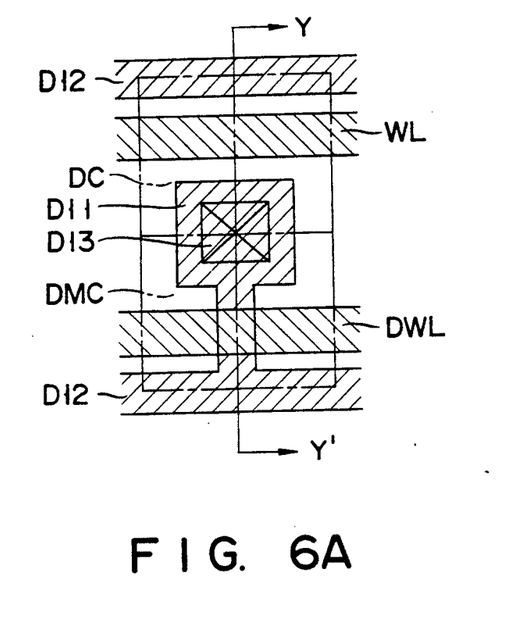
FIG. 6A is a pattern plan view of the dummy capacitance cell and dummy memory cell in FIG. 4.
Figure 6B:
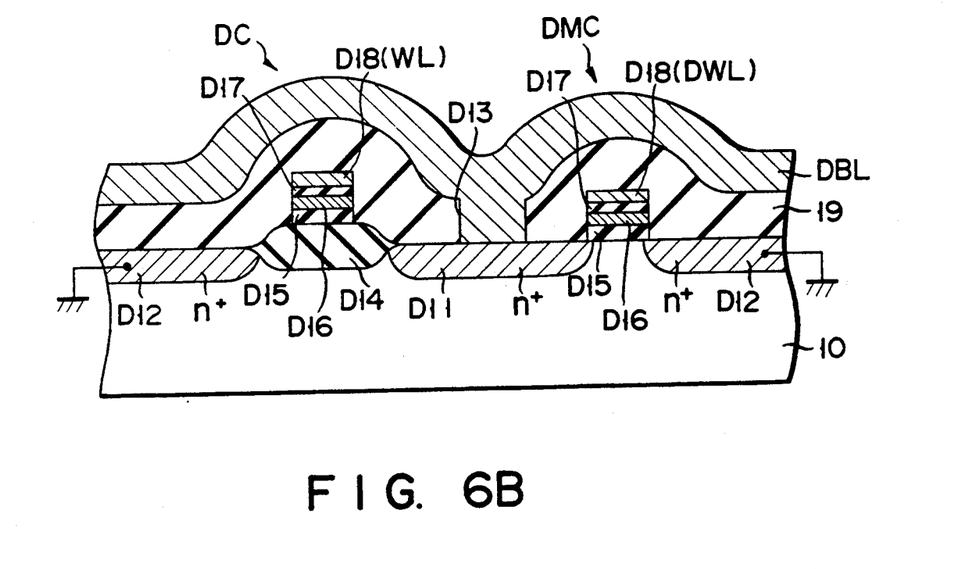
FIG. 6B is a cross sectional view of the dummy capacitance cell and dummy memory cell taken along line Y—Y' in FIG. 6A.

FIGS. 6A and 6B show the pattern construction of dummy capacitance cell DC in FIG. 4. FIG. 6A is pattern plan view and FIG. 6B is a sectional view taken along line Y—Y' of FIG. 6A. Dummy capacitance cell DC is formed with a field transistor having a gate electrode formed of a polysilicon layer. That is, field insulation film D14 is formed on that portion of semiconductor substrate 10 which lies between drain diffusion region D11 and source diffusion region D12. First gate insulation film D15 is formed on field insulation film D14, and floating gate D16 is formed on first gate insulation film D15. Control gate D18 (word line WL) is formed on second gate insulation film D17 which is in turn formed on floating gate D16. Interlayer insulation film 19 is formed on the entire surface of the resultant structure, and contact hole D13 is formed in that portion of interlayer insulation film 19 which lies on drain diffusion region D11. Dummy bit line DBL is formed on interlayer insulation film 19, and is connected to drain diffusion region D11 through contact hole D13. Dummy cell DMC has basically the same construction as memory cell MC shown in FIGS. 5A and 5B.

According to the EPROM with the construction shown in FIGS. 4, 5A, 5B, 6A and 6B, memory cells MC, dummy memory cell DMC and dummy capacitance cells DC are formed in the same memory cell array MCA, and therefore the pattern construction can be simplified and the bit line load capacitance and the dummy bit line load capacitance can be easily set equal to each other. Further, since the pattern of memory cell MC can be made substantially the same as that of dummy capacitance cell DC, the bit line load capacitance and the dummy bit line load capacitance can be set substantially equal to each other. As a result, even when the power source voltage fluctuate at the data output time, the bit line potential and the dummy bit line potential will fluctuate in synchronism with each other. Therefore, the level relation between the potentials will not be reversed, thus ensuring that readout data of "1" or "0" from memory cell MC can be correctly determined.

Figure 7A:
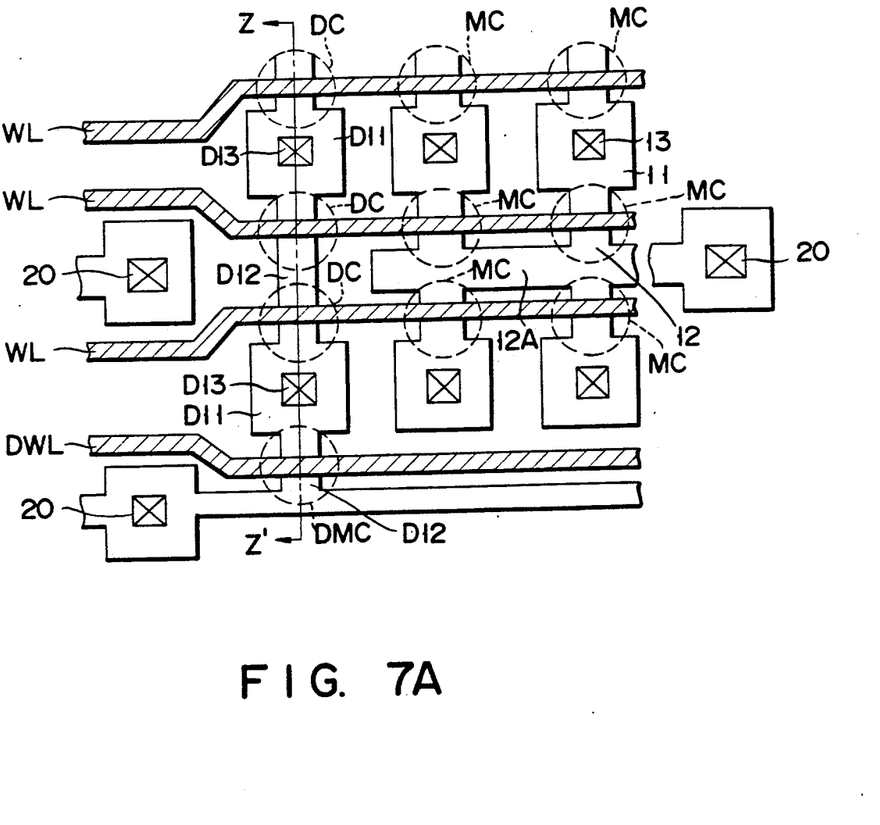
FIG. 7A is a pattern plan view of the memory cell, dummy memory cell and dummy capacitance cell corresponding to the dummy bit line load capacitance shown in FIG. 4, for illustration of a semiconductor memory device according to a second embodiment of this invention.
Figure 7B:
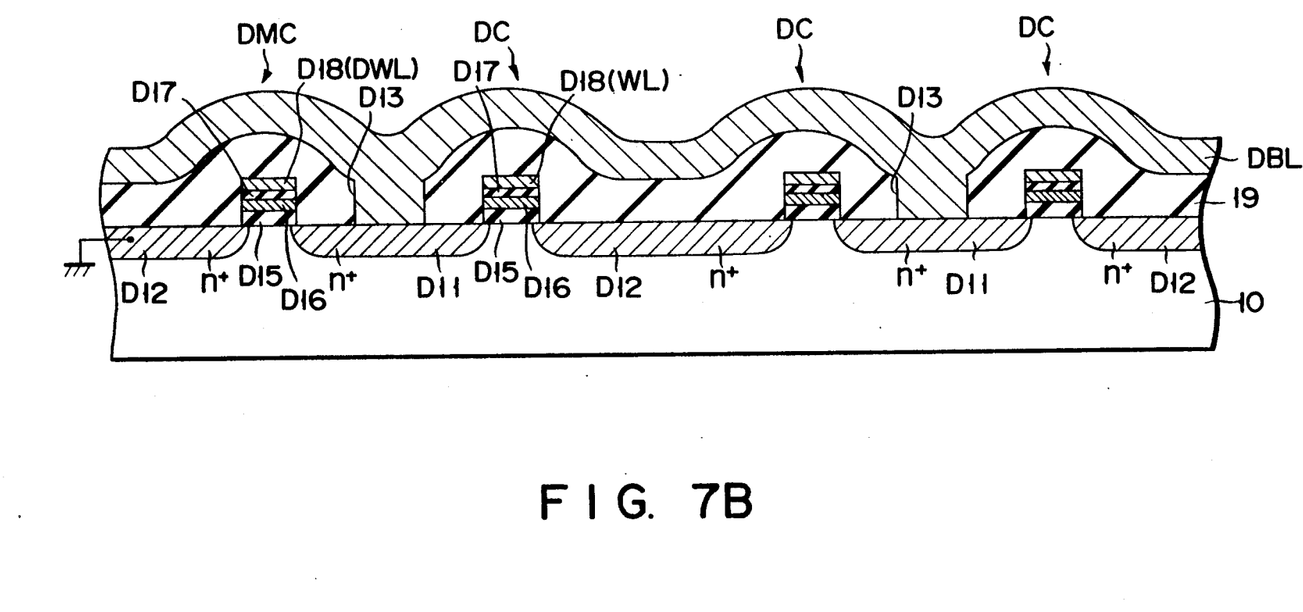
FIG. 7B is a cross sectional view of the dummy capacitance cell and dummy memory cell taken along line Z—Z' of FIG. 7A.

FIGS. 7A and 7B show another embodiment of this invention in which another pattern layout of memory cell array MCA of FIG. 4 is shown. FIG. 7A is pattern plan view and FIG. 7B is a sectional view taken along line Z—Z' of FIG. 7A. FIG. 7A is a cross section of the dummy capacitance cell and dummy memory cell. In FIGS. 6A and 6B, dummy capacitance cell DC is formed of the field transistor having a gate electrode formed of a polysilicon layer, but in FIGS. 7A and 7B, it is formed of a transistor with the same structure as memory cell MC. In this case, the source diffusion regions of the transistors used as dummy capacitance cells DC are set in the electrically floating state. That is, drain diffusion regions 11 of memory cells MC arranged in a matrix form are respectively connected to the bit lines (not shown) via drain contact portions 13. Source diffusion regions 12 of those of memory cells MC which lie on the same row are connected together via diffusion region 12A which is in turn connected to a ground terminal (Vss power source line) via source contact area 20. Dummy capacitance cells DC and dummy memory cell DMC are formed with the same structure as memory cells MC on a column ((n+1)th column) different from those of memory cells MC. Each of drain diffusion regions D11 of dummy capacitance cells DC and dummy memory cell DMC is connected to dummy bit line DBL via corresponding drain contact portion D13. Like the source diffusion region of memory cell MC, source diffusion region D12 of dummy memory cell DMC is connected to the ground terminal via source contact portion 20. Adjacent two of source diffusion regions D12 of dummy capacitance cells DC are connected together, separated from source diffusion region 12 of adjacent memory cell MC and set in the electrically floating condition.

With this construction, even when dummy capacitance cell DC connected to selected word line WL is set conductive, charges on dummy bit line DBL will not be discharged because source diffusion region D12 thereof is set in the electrically floating condition. Further, since MOS transistors different from field transistor having a gate electrode formed of a polysilicon layer, are formed as dummy capacitance cells DC, it is not necessary to increase the cell size in order to prevent the field inversion of the transistor. Therefore, the dummy capacitance cell transistor can be formed as small as the memory cell transistor. As a result, the chip size can be made smaller than that with the pattern structure shown in FIGS. 5A, 5B, 6A and 6B.

Figure 8:
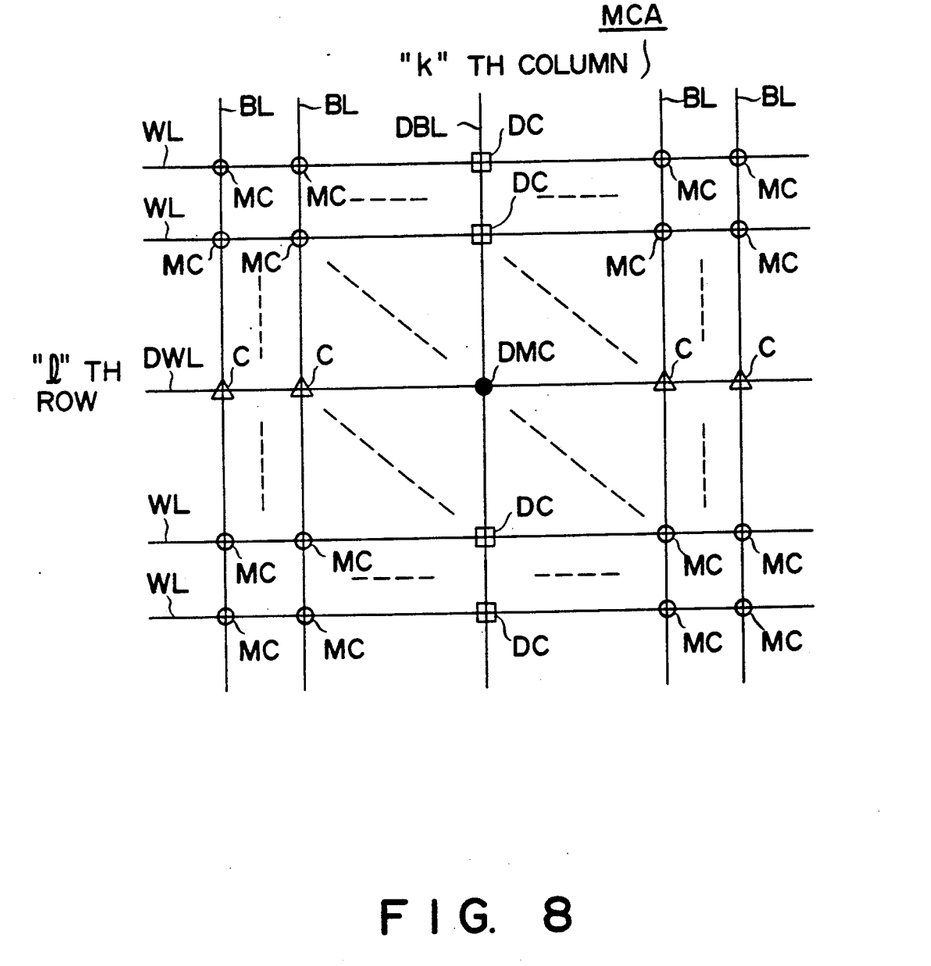
FIG. 8 is a diagram showing another arrangement of the memory cell, dummy memory cell and dummy capacitance cell corresponding to the dummy bit line load capacitance in the EPROM of FIG. 3.

FIG. 8 shows another arrangement of memory cells MC, dummy memory cell DMC and dummy capacitance cells DC each corresponding to load capacitance C3 of dummy bit line DBL shown in FIG. 3. Dummy capacitance cells DC are arranged on a "k"th column of the memory cell array MCA, and array edge memory cells C are arranged on an "l"th row of the memory cell array x−1MCA. The "k"th may be any one selected from members 1 through n+1, and "l"th may be any one selected from members 1 through m+1. The dummy memory cell DMC is arranged in the intersecting position of the "l"th row and "k"th column of the memory cell array MCA. With the construction shown in FIG. 8, the same effect as that obtained in the circuit layout of FIG. 4 can be attained.

As described above, according to the semiconductor memory device of this invention, since the bit line load capacitance of the data storing cells and the dummy bit line load capacitance of the dummy capacitance cells can be set in the balanced condition, readout data "1" or "0" from the memory cell can be correctly determined even when fluctuation in the power source voltage has occurred. In addition, if a cell having the source diffusion region set in the electrically floating condition is used as a dummy capacitance cell, charges on the dummy bit line will not be discharged even when the dummy capacitance cell is set conductive. In this way, since it is not necessary to increase the size of the dummy capacitance cell, an increase in the chip size can be suppressed to a minimum.

What is claimed is:

1. A semiconductor memory device comprising:
   a memory cell array including data storing memory cells which are arranged in a form of m rows and n columns;
   m word lines arranged along respective rows of said data storing memory cells for selecting a row of said memory cells;
   n bit lines arranged along respective columns of said data storing memory cells for selecting a column of said memory cells to permit data transfer;
   dummy capacitance cells arranged on a "k"th column of said memory cell array and respectively connected to said m word lines, "k" defining any one number selected from 1 through n+1;
   array edge memory cells arranged on an "l"th row of said memory cell array and respectively connected to said n bit lines, which provide memory cell array symmetry without affecting access operation of the memory device, "l" defining any number selected from 1 through m+1;
   one dummy memory cell arranged in an intersecting position of the "l"th row and "k"th column of said memory cell array, said one dummy memory cell being selected in the readout operation every time a data storing memory cell in the array is selected;
   a dummy bit line connected to said dummy capacitance cells and said dummy memory cell; and
   a dummy word line connected to said array edge memory cells and said dummy memory cell.

2. A semiconductor memory device according to claim 1, wherein said memory cells each include a floating gate type MOS transistor.

3. A semiconductor memory device according to claim 1, wherein said dummy memory cell is formed with the same structure as that of said data storing memory cells.

4. A semiconductor memory device according to claim 3, wherein said dummy memory cell includes a floating gate type MOS transistor.

5. A semiconductor memory device according to claim 1, wherein said dummy capacitance cells each include a field effect transistor having a gate electrode formed of a polysilicon layer.

6. A semiconductor memory device according to claim 5, wherein said field effect transistor having a gate electrode formed of a polysilicon layer includes a semiconductor substrate of a first conductivity type; a drain diffusion region of a second conductivity type formed in a surface area of said semiconductor substrate and connected to said dummy bit line; a source diffusion region of the second conductivity type formed separately from said drain diffusion region in the surface area of said semiconductor substrate and connected to a potential supplying source; a field insulation film formed on that portion of said semiconductor substrate which lies between said drain diffusion region and source diffusion film; a first insulation film formed on said field insulation; a floating gate formed on said first insulation film; a second insulation film formed on said floating gate; and a word line formed on said second insulation film and serving as a control gate.

7. A semiconductor memory device according to claim 1, wherein each of said dummy capacitance cells is formed with the same structure as said data storing memory cells.

8. A semiconductor memory device according to claim 7, wherein each of said dummy capacitance cells includes a floating gate type MOS transistor which has a drain diffusion region connected to said dummy bit line and a source diffusion region set in an electrically floating condition.

9. A semiconductor memory device according to claim 1, further comprising sense amplifier means for comparing a potential read out from a selected one of said data storing memory cells on to said bit line with a potential read out from said dummy memory cell on to said dummy bit line and amplifying a potential difference therebetween.

10. A semiconductor memory device according to claim 9, wherein said sense amplifier means includes a differential amplifier; a first bias circuit/load circuit connected to a first input terminal of said differential amplifier and a second bias circuit/load circuit connected to a second input terminal of said differential amplifier.

11. A semiconductor memory device comprising:

a memory cell array including data storing memory cells which are arranged in a form of m rows and n columns;

m word lines arranged along respective rows of said data storing memory cells for selecting a row of said memory cells;

n bit lines arranged along respective columns of said data storing memory cells for selecting a column of said memory cells to permit data transfer;

dummy capacitance cells, comprising transistors whose channel regions are non-functional, arranged on a "k"th column of said memory cell array and respectively connected to said m work lines, "k" defining any one number selected from 1 through n+1;

array edge memory cells arranged on an "l"th row of said memory cell array and respectively connected to said n bit lines, which provide memory cell array symmetry without affecting access operation of the memory device, "l" defining any number selected from 1 through m+1;

one dummy memory cell arranged in an intersecting position of the "l"th row and "k"th column of said memory cell array, said one dummy memory cell being selected in the readout operation every time a data storing memory cell in the array is selected;

a dummy bit line connected to said dummy capacitance cells and said dummy memory cell; and a dummy word line connected to said array edge memory cells and said dummy memory cell.

* * * * *

UNITED STATES PATENT AND TRADEMARK OFFICE
CERTIFICATE OF CORRECTION

PATENT NO. : 5,105,385
DATED : April 14, 1992
INVENTOR(S) : Nobuaki Ohtsuka et al.

It is certified that error appears in the above-identified patent and that said Letters Patent is hereby corrected as shown below:

Claim 6, column 8, line 38, change "film" (first occurrence) to --region--.

Claim 6, column 8, line 39, after "insulation" insert --film--.

On the title page: Item [54] and Column 1, line 1, change "EEPROM" to --EPROM--.

Signed and Sealed this

Sixteenth Day of November, 1993

Attest:

*Attesting Officer*

BRUCE LEHMAN
*Commissioner of Patents and Trademarks*